(12) United States Patent
Takizawa

(10) Patent No.: US 9,059,393 B2
(45) Date of Patent: *Jun. 16, 2015

(54) VIBRATOR ELEMENT, VIBRATOR, OSCILLATOR, AND ELECTRONIC DEVICE

(71) Applicant: Seiko Epson Corporation, Tokyo (JP)

(72) Inventor: Teruo Takizawa, Matsumoto (JP)

(73) Assignee: Seiko Epson Corporation (JP)

(*) Notice: Subject to any disclaimer, the term of this patent is extended or adjusted under 35 U.S.C. 154(b) by 60 days.

This patent is subject to a terminal disclaimer.

(21) Appl. No.: 13/789,893

(22) Filed: Mar. 8, 2013

(65) Prior Publication Data

US 2013/0194049 A1 Aug. 1, 2013

Related U.S. Application Data

(63) Continuation of application No. 13/158,662, filed on Jun. 13, 2011, now Pat. No. 8,416,027.

(30) Foreign Application Priority Data

Jul. 29, 2010 (JP) ................................. 2010-170556

(51) Int. Cl.
| H03B 5/32 | (2006.01) |
| H01L 41/053 | (2006.01) |
| H03H 9/215 | (2006.01) |
| H03H 9/05 | (2006.01) |
| H03H 9/10 | (2006.01) |
| H01L 41/22 | (2013.01) |

(52) U.S. Cl.
CPC .............. *H01L 41/053* (2013.01); *Y10T 29/42* (2015.01); *H03H 9/0552* (2013.01); *H03H 9/1021* (2013.01); *H03H 9/215* (2013.01); *H01L 41/22* (2013.01); *H03B 5/32* (2013.01)

(58) Field of Classification Search
CPC ......... H01L 41/053; H03B 5/32; H03H 9/215

USPC .............................. 331/156; 310/370; 333/200
See application file for complete search history.

(56) References Cited

U.S. PATENT DOCUMENTS

| 8,212,454 | B2 | 7/2012 | Onitsuka et al. | |
| 8,416,027 | B2 * | 4/2013 | Takizawa | ................. 331/156 |

FOREIGN PATENT DOCUMENTS

| JP | 02-032229 | 2/1990 |
| JP | 2005-331485 | 12/2005 |
| JP | 2009-005022 | 1/2009 |
| JP | 2009-005023 | 1/2009 |
| JP | 2009-005024 | 1/2009 |

OTHER PUBLICATIONS

Roszhart, T.V., "The Effect of Thermoelastic Internal Friction on the Q of Micromachined Silicon Resonators", Kearfott Guidance and Navigation Corporation, Solid-State Sensor and Actuator Workshop, pp. 13-16, 4th Technical Digest, IEEE, 1990.

* cited by examiner

*Primary Examiner* — Joseph Chang
(74) *Attorney, Agent, or Firm* — Harness, Dickey & Pierce, P.L.C.

(57) ABSTRACT

A vibrator element includes: a base having a mounting surface; a vibrating arm which is extended from the base and has a first surface and a second surface that faces the first surface and is positioned on the mounting surface side, and which performs flexural vibration in a direction normal to the first and second surfaces; and a laminated structure which is provided on at least one of the first and second surfaces of the vibrating arm, and which includes at least a first electrode, a second electrode, and a piezoelectric layer disposed between the first and second electrodes, in which the vibrating arm is warped toward the mounting surface side.

9 Claims, 6 Drawing Sheets

VIBRATOR ELEMENT, VIBRATOR, OSCILLATOR, AND ELECTRONIC DEVICE

CROSS-REFERENCE TO RELATED APPLICATIONS

This is a continuation application of U.S. application Ser. No. 13/158,662 filed Jun. 13, 2011 which claims priority to Japanese Patent Application No. 2010-170556, filed Jul. 29, 2010 all of which are expressly incorporated by reference herein in their entireties.

BACKGROUND

1. Technical Field

The present invention relates to a vibrator element, a vibrator, an oscillator, and an electronic device, and more particularly, to a vibrator element that excites flexural vibration and a vibrator, an oscillator, and an electronic device each having the vibrator element.

2. Related Art

In a vibrator element that excites flexural vibration, a temperature difference occurs between a compressed portion in which compressive stress of a vibrating arm acts and an expanded portion in which tensile stress of the vibrating arm acts. The vibrator element loses vibration energy due to thermal conduction which occurs in order to reduce this temperature difference. A decrease in the Q value caused by the thermal conduction is referred to as a thermoelastic loss effect (hereinafter referred to as thermoelastic loss). Therefore, it is necessary to design the vibrator element considering the thermoelastic loss. For example, according to the technique disclosed in JP-UM-A-2-32229, for example, the Q value indicating the stability of resonance can be improved by forming grooves in the arm portion of a crystal vibrator.

However, when the vibrator element is miniaturized and made thin in accordance with the miniaturization and reduction in the thickness of electronic devices, it is very difficult to form grooves in the vibrating portion with high accuracy.

In order to solve such a problem, JP-A-2009-5022, JP-A-2009-5023, and JP-A-2009-5024 disclose a vibrator element in which a vibrating portion is made thin and a piezoelectric layer is formed on the vibrating portion. In the vibrator element having such a configuration, the vibrator element can be excited to vibrate in a direction (normal direction) crossing the formation surface of the piezoelectric layer by applying an electric field with different potentials to the front and rear surfaces of the piezoelectric layer.

Moreover, JP-A-2005-331485 discloses a vibrator element in which a vibrating arm has a curved surface shape so as to form a concave shape on the electrode side in an initial standby state where no dynamic external force is applied, thereby improving the alignment properties of the piezoelectric layer and obtaining high piezoelectric efficiency.

In recent years where the size and thickness have been decreasing further, the cavity in a package that mounts the vibrator element therein has also been narrowing. Therefore, in the vibrator elements having the vibrating portion that performs flexural vibration in the normal direction as disclosed in JP-A-2009-5022, JP-A-2009-5023, JP-A-2009-5024, and JP-A-2005-331485, there is a possibility that the tip end of the vibrating portion makes contact with the lid of the package when it receives an impact during oscillation or when dropped. Particularly, in the vibrator element having the configuration as disclosed in JP-A-2005-331485, the possibility of contacting is high, which makes it difficult to decrease the height of a vibrator.

SUMMARY

An advantage of some aspects of the invention is that it provides a vibrator element and a method for manufacturing the same, which provides high accuracy and high reliability and in which there is no possibility that a vibrating arm makes contact with the inner wall of a lid or the like when the vibrator element receives an impact during oscillation or when dropped. Another advantage of some aspects of the invention is that it provides a vibrator and an oscillator each mounting the vibrator element, and an electronic device having the vibrator or the oscillator.

APPLICATION EXAMPLE 1

This application example of the invention is directed to a vibrator element including: a base having a mounting surface; a vibrating arm which is extended from the base and has a first surface and a second surface that faces the first surface and is positioned on the mounting surface side, and which performs flexural vibration in a direction normal to the first and second surfaces; and a laminated structure which is provided on at least one of the first and second surfaces of the vibrating arm, and which includes at least a first metal layer, a second metal layer, and a piezoelectric layer disposed between the first and second metal layers, in which the vibrating arm is warped toward the mounting surface side.

With this configuration, even when a package or the like that mounts the vibrator element therein has a small thickness, since the vibrating arm which is a vibrating portion is mounted in the package in a state of being warped toward the mounting surface side in advance, there is no possibility that the vibrating arm makes contact with the lid of the package when the vibrator element performs flexural vibration. Therefore, when a vibration device is configured using the vibrator element of this application example of the invention, it is possible to obtain high accuracy and high reliability.

APPLICATION EXAMPLE 2

This application example of the invention is directed to the vibrator element of the above application example, wherein, when the length of the vibrating arm is L, the thickness of the vibrating arm is t, the Young's modulus of the vibrating arm is $E_s$, the Poisson ratio of the vibrating arm is $v_s$, the thickness of the piezoelectric layer is d, and the residual stress of the piezoelectric layer is $\sigma$, the amount of warpage $\delta$ of the vibrating arm is obtained by the following equation.

$$\delta = \frac{3L^2(1-v_s)d}{E_s t^2}\sigma$$

With this configuration, it is possible to optimally set the amount of warpage of the vibrator element and to reliably prevent the vibrating arm from making contact with the lid of the package when the vibrator element performs flexural vibration.

APPLICATION EXAMPLE 3

This application example of the invention is directed to the vibrator element of the application example 1 or 2, wherein the thickness of the base is greater than the thickness of the vibrating arm.

With this configuration, when the vibrator element is mounted in the package, the height of a void portion between the lower surface (second surface) of the vibrating arm and the inner bottom surface of the package can be controlled by the thickness of the base. Thus, there is no possibility that the vibrating arm makes contact with the inner bottom surface of the package when the vibrator element performs flexural vibration. Therefore, when a vibration device is configured using the vibrator element of this application example of the invention, it is possible to obtain higher reliability.

APPLICATION EXAMPLE 4

This application example of the invention is directed to the vibrator element of the application example 3, wherein the base may have a principal surface facing the mounting surface, and the vibrating arm may perform the flexural vibration within a range between the mounting surface and the principal surface.

With this configuration, there is no possibility that the tip end of the vibrating arm makes contact with the inner wall surface or the lid of the package even when the vibrating arm is excited.

APPLICATION EXAMPLE 5

This application example of the invention is directed to the vibrator element of any of the application examples 1 to 4, wherein the piezoelectric layer may be formed on both the first and second surfaces.

With this configuration, it is possible to increase the amount of warpage of the vibrating arm by forming the piezoelectric layer such that compressive stress remains in the first surface and forming the piezoelectric layer such that tensile stress remains in the second surface.

APPLICATION EXAMPLE 6

This application example of the invention is directed to a method for manufacturing a vibrator element including: a base having a mounting surface; a vibrating arm which is extended from the base; and a laminated structure which is provided on the vibrating arm, and which includes at least a first metal layer, a second metal layer, and a piezoelectric layer disposed between the first and second metal layers, in which the vibrating arm has a first surface and a second surface that faces the first surface and is positioned on the mounting surface side, the laminated structure is formed on the first surface side, and at least one of the first metal layer, the second metal layer, and the piezoelectric layer is deposited so that compressive stress remains therein.

When the vibrator element is manufactured by such a method, the vibrating arm is warped toward the mounting surface side. Therefore, even when a package or the like that mounts the vibrator element therein has a small thickness, there is no possibility that the vibrating arm which is a vibrating portion makes contact with the inner bottom portion or the lid of the package. Therefore, when a vibration device is configured using the vibrator element of this application example of the invention, it is possible to obtain high accuracy and high reliability.

APPLICATION EXAMPLE 7

This application example of the invention is directed to a method for manufacturing a vibrator element including: a base having a mounting surface; a vibrating arm which is extended from the base; and a laminated structure which is provided on the vibrating arm, and which includes at least a first metal layer, a second metal layer, and a piezoelectric layer disposed between the first and second metal layers, in which the vibrating arm has a first surface and a second surface that faces the first surface and is positioned on the mounting surface side, the laminated structure is formed on the second surface side, and at least one of the first metal layer, the second metal layer, and the piezoelectric layer is deposited so that tensile stress remains therein.

When the vibrator element is manufactured by such a method, the tip end of the vibrating arm can be warped toward the mounting surface side of the base. Therefore, even when a package or the like that mounts the vibrator element therein has a small thickness, there is no possibility that the vibrating arm which is a vibrating portion makes contact with the inner bottom portion or the lid of the package. Therefore, when a vibration device is configured using the vibrator element of this application example of the invention, it is possible to obtain high accuracy and high reliability.

APPLICATION EXAMPLE 8

This application example of the invention is directed to a vibrator including the vibrator element of any of the application examples 1 to 5; and a package having the vibrator element mounted therein.

With this configuration, it is possible to obtain a vibrator which has high accuracy and high reliability even when it is miniaturized.

APPLICATION EXAMPLE 9

This application example of the invention is directed to an oscillator including the vibrator element of any of the application examples 1 to 5; and an electronic component for driving the vibrator element.

With this configuration, it is possible to obtain an oscillator which has high accuracy and high reliability even when it is miniaturized.

APPLICATION EXAMPLE 10

This application example of the invention is directed to an electronic device in which the vibrator element of any of the application examples 1 to 5 is mounted.

With this configuration, it is possible to cope with miniaturization of electronic devices.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of a vibrator element, a vibrator, an oscillator, and an electronic device of the invention will be described with reference to the drawings.

Figure 1A:
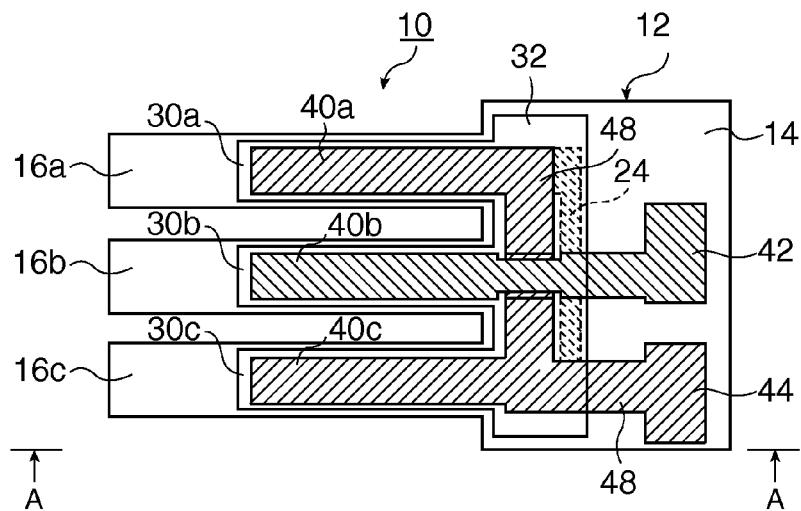
FIGS. 1A to 1C are three planar views illustrating a configuration of a vibrator element according to an embodiment.
Figure 1B:
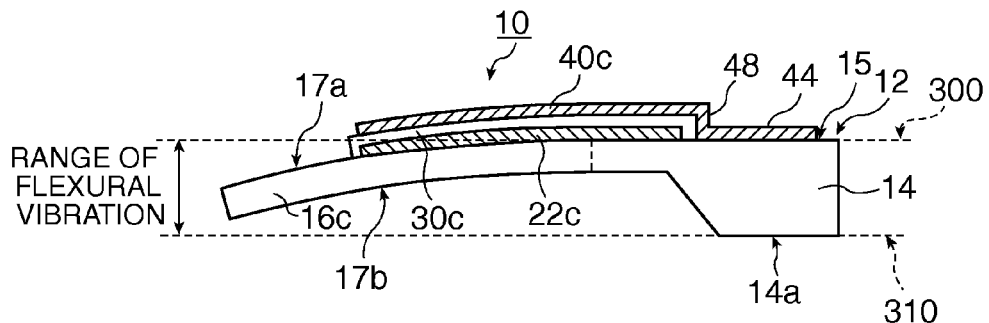
Figure 1C:
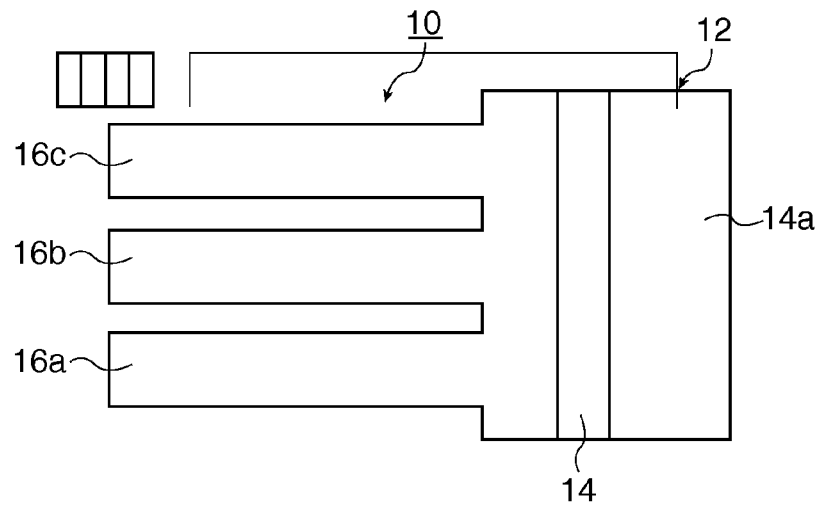
Figure 2:
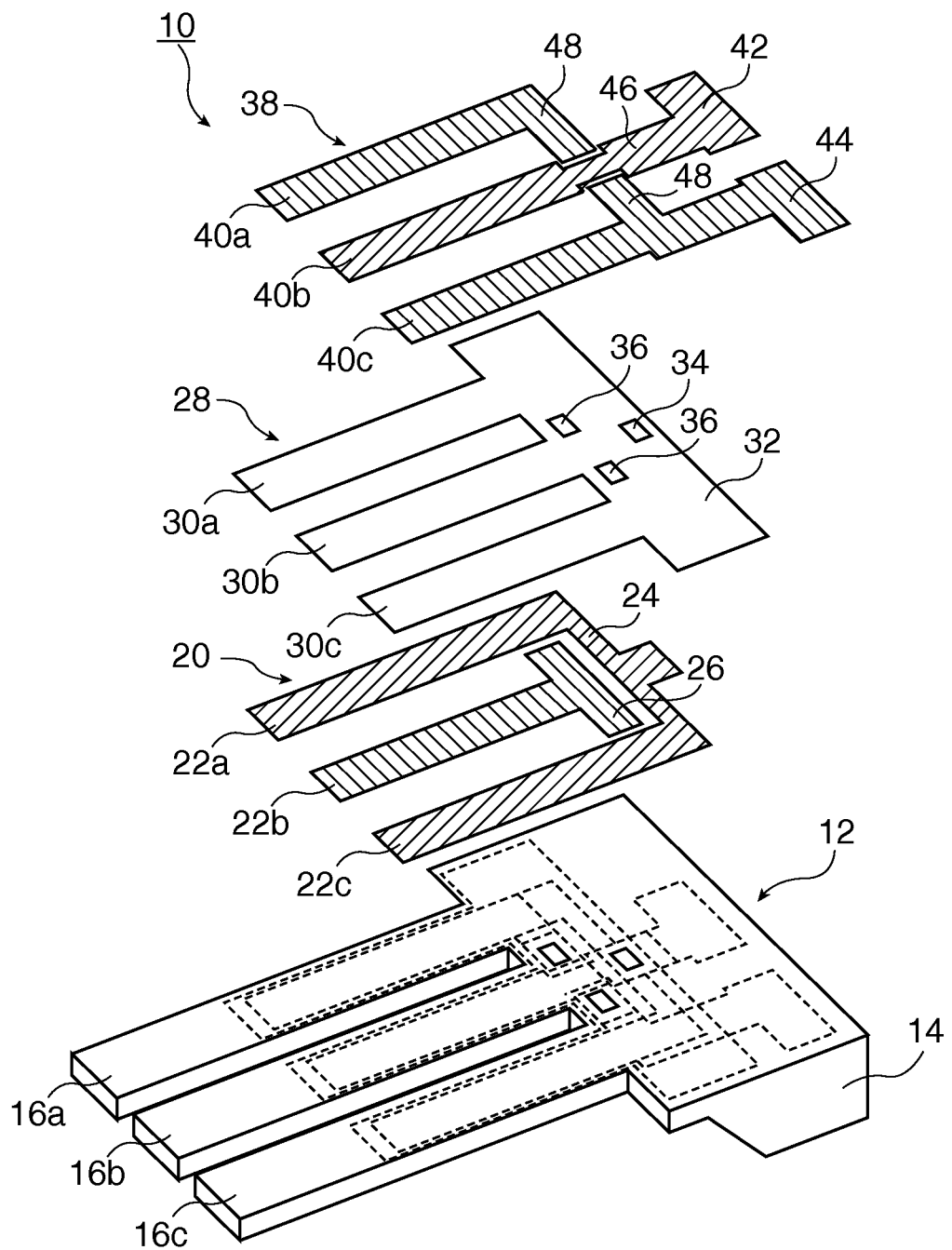
FIG. 2 is an exploded perspective view illustrating a configuration of the vibrator element according to the embodiment.

First, a vibrator element according to a first embodiment will be described with reference to FIGS. 1A to 1C and FIG. 2. In FIGS. 1A to 1C, FIG. 1A is a plan view of a vibrator element, FIG. 1B is a view taken along the arrow A-A in FIG. 1A, and FIG. 1C is a rear view of the vibrator element. Moreover, FIG. 2 is an exploded perspective view of the vibrator element. A vibrator element 10 according to this embodiment includes a substrate 12, a piezoelectric layer 28, a first electrode (first metal layer) 20, and a second electrode (second metal layer) 38.

Figure 3A:
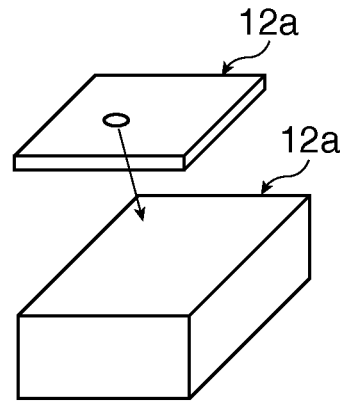
FIGS. 3A to 3F are views illustrating the process of manufacturing the vibrator element according to the embodiment.
Figure 3B:
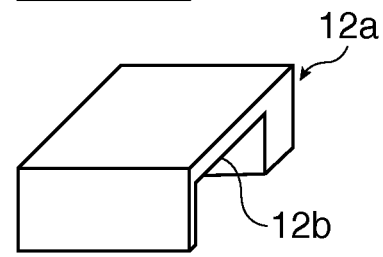
Figure 3C:
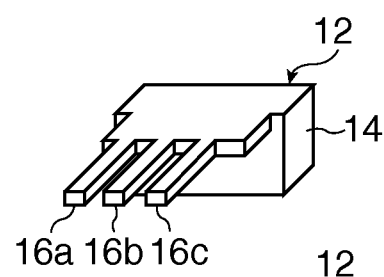
Figure 3D:
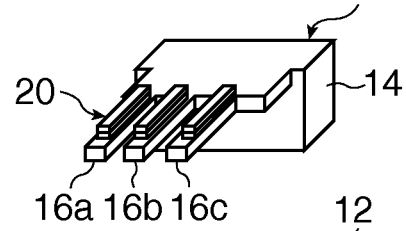

The substrate 12 includes a base 14 formed of a quartz crystal, for example, and a plurality of vibrating arms 16 (16a to 16c) which are extended from the base 14 as the base end thereof. In the embodiment illustrated in FIGS. 1A to 1C and FIG. 2, three vibrating arms are provided. In this embodiment, the base 14 has a greater thickness than the vibrating arm 16 and has a shape so as to be able to maintain mechanical strength necessary for mounting. Moreover, when the vibrator element 10 is mounted in a package, the height of a void portion between the lower surface of the vibrating arm 16 and the inner bottom surface of the package can be controlled by the thickness of the base 14. On the other hand, the vibrating arm 16 has a smaller thickness than the base 14, so that thermoelastic loss during vibration can be suppressed. The vibrating arm 16 has a first surface 17a and a second surface 17b facing the first surface 17a. Furthermore, the base 14 constitutes a mounting surface 14a for fixing the vibrator element 10 and a principal surface 15 facing the mounting surface 14a. When the substrate 12 is formed of a quartz crystal, an element substrate 12a (see FIGS. 3A and 3B) used for forming the substrate 12 is preferably a Z-cut substrate, and may be an X-cut or an AT-cut substrate. Since a voltage is not directly applied to the substrate 12 according to the embodiment, essentially, the cut angle has no effect on the vibration characteristics. However, when the Z-cut element substrate 12a is used, it is possible to obtain a property that it can be processed easily.

A laminated structure which basically includes the first electrode 20, the piezoelectric layer 28, and the second electrode 38 is formed on the first surface 17a of the vibrating arm 16. Here, it is assumed that the first electrode 20 is an electrode which is formed before the piezoelectric layer 28 is formed, and the second electrode 38 is an electrode which is formed after the piezoelectric layer 28 is formed. Thus, the expressions of the first and second electrodes 20 and 38 have no relation with the potentials of the respective electrodes. The potentials of the respective electrodes depend on the direction of hatching on the first and second electrodes 20 and 38 illustrated in the exploded perspective view of FIG. 2 (the details of which will be described later). As a formation material for the first and second electrodes 20 and 38, a material which has good adhesion with a quartz crystal which is the substrate 12 and which tends to accelerate alignment properties of the piezoelectric layer 38 may be used. Examples of a material widely used as an electrode material include Au, Pt, Al, Ag, Cu, Mo, Cr, Nb, W, Ni, Fe, Ti, Co, Zn, and Zr. In this embodiment, it is assumed that the first and second electrodes 20 and 38 are formed of a two-layered metal layer in which the lower layer is formed of Ti, and the upper layer is formed of Au. Moreover, examples of a material for the piezoelectric layer 28 include ZnO, AlN, PZT, $LiNbO_3$, and $KNbO_3$. In this embodiment, it is assumed that the piezoelectric layer 28 is mainly formed of AlN. The material Ti has good adhesion with quartz crystal which is the substrate 12, and the material Au can form the (111) plane on a film surface. The material AlN forms the (111) plane of the Au layer to thereby form a columnar crystal along the (111) plane, and a piezoelectric film (piezoelectric layer) having high alignment properties can be obtained.

As illustrated in FIG. 2, the first electrode 20 includes first-layer excitation electrodes 22a, 22b, and 22c and first-layer extraction electrodes 24 and 26, for example. Here, the first-layer excitation electrode 22a and the first-layer excitation electrode 22c have the same potential and are connected by the first-layer extraction electrode 24. On the other hand, the first-layer excitation electrode 22b is connected to the extraction electrode 26 for realizing connection to the second electrode 38, details of which will be described later.

The piezoelectric layer 28 is formed on the first electrode 20 described above. Specifically, the piezoelectric layer 28 includes excitation electrode-covering portions 30a, 30b, and 30c formed on the vibrating arms 16a, 16b, and 16c, respectively, and an extraction electrode-covering portion 32 formed on the base 14. The extraction electrode-covering portion 32 has openings 34 and 36 for electrically connecting the first electrode 20 described above to the second electrode 38, details of which will be described later. The piezoelectric layer 28 has a property such that when voltages of different potentials are applied to the front and rear surfaces of the piezoelectric layer 28, the piezoelectric layer 28 is compressed or expanded in the thickness direction thereof to perform flexural vibration in an off-plane direction (a direction crossing the formation surface of the piezoelectric layer 28).

Here, the piezoelectric layer 28 according to this embodiment is formed on the first surface 17a so that compressive stress remains therein. With such a property, when the vibrator element 10 is in an initial standby state, a force that causes the piezoelectric layer 28 to release the compressive stress acts on the piezoelectric layer 28. Therefore, tensile stress is applied to the contact portions of the vibrating arm 16 and the piezoelectric layer 28, and the vibrating arm 16 is warped toward the mounting surface 14a side of the base 14. With this configuration, when the vibrator element 10 is mounted in a package or the like, it is possible to prevent the occurrence of a situation in which the tip end of the vibrating arm 16 makes contact with the lid of the package when the vibrating arm 16 performs flexural vibration. Therefore, this contributes to miniaturizing a vibration device.

The second electrode 38 includes second-layer excitation electrodes 40a, 40b, and 40c, second-layer extraction electrodes 46 and 48, and input/output electrodes 42 and 44, for example. Here, the second-layer excitation electrode 40b and the input/output electrode 42 have the same potential and are connected by the second-layer extraction electrode 46. Moreover, the second-layer extraction electrode 46 is electrically connected to the first-layer extraction electrode 24 through the opening 34 formed in the piezoelectric layer 28 described above. Therefore, a voltage of the same potential is applied to the first-layer excitation electrodes 22a and 22c and the second-layer excitation electrode 40b. On the other hand, although the second-layer excitation electrodes 40a and 40c and the input/output electrode 44 have the same potential, the second-layer extraction electrode 48 is divided by the second-layer extraction electrode 46 and is not directly connected to the second-layer extraction electrode 46. However, the second-layer extraction electrode 48 is electrically connected to the first-layer extraction electrode 26 through the opening 36 formed in the piezoelectric layer 28 described above, and the second-layer excitation electrodes 40a and 40c, the first-layer excitation electrode 22b, and the input/output electrode 44 are electrically connected through the first-layer extraction electrode 26 and the second-layer extraction electrode 48. Although the first-layer extraction electrodes 24 and 26 having different potentials and the second-layer extraction electrodes 46 and 48 having different potentials are illustrated as partially overlapping each other in FIGS. 1A to 1C and FIG. 2, in practice, extraction electrodes having different potentials are designed so as not to overlap each other on the front and rear surfaces of the piezoelectric layer 28. This is to suppress excitation of portions other than the vibrating arm 16.

According to the vibrator element 10 having such a configuration, even when the vibrating arm 16 performs flexural vibration in a state of being mounted on a thin package, there is no possibility that the vibrating arm 16 makes contact with the inner bottom surface or the lid of the package. Therefore, this can contribute to the manufacture of small, high-performance, and high-reliability vibration devices. Moreover, in the vibrator element 10 having the above-described configuration, it may be beneficial to design the amount of warpage of the vibrating arm 16 so that the vibrating arm 16 performs flexural vibration within a range between an imaginary horizontal plane 300 extending horizontally from the principal surface 15 of the base 14 and an imaginary horizontal plane 310 extending horizontally from the mounting surface 14a. With this configuration, it is possible to reliably eliminate the possibility that the tip end of the vibrating arm 16 makes contact with the inner bottom surface or the lid of the package during the excitation.

Next, the process of manufacturing the vibrator element 10 according to this embodiment will be described with reference to FIGS. 3A to 3F. First, the element substrate 12a serving as the base of the vibrator element 10 is prepared. In this embodiment, a quartz crystal is used as the element substrate 12a. When the element substrate 12a is formed of a quartz crystal, the thickness thereof is preferably about 50 to 100 μm (see FIG. 3A).

Subsequently, a part of the element substrate 12a is made thin. The thinning may be achieved by performing etching using buffered hydrofluoric acid (BHF). At this time, when the element substrate 12a is formed of a quartz crystal, the thickness of a thin portion 12b may be about 2 to 10 μm (see FIG. 3B).

After the thinning, the outer shape of the substrate 12 is formed. The outer shape of the substrate 12 is preferably formed by performing etching from the first surface side. The etching may use BHF (see FIG. 3C).

After the outer shape of the substrate 12 is formed, the first electrode 20 is formed on the first surface. When forming the first electrode 20, first, a metal layer is formed on the entire surface of the first surface. The metal layer may be formed using a method such as magnetron sputtering. After the metal layer is formed, a resist is applied on the entire surface. After that, a mask is formed using a resist film by a photolithography method, and the metal layer is etched to thereby obtain a metal pattern corresponding to the shape of the first electrode 20 (see FIG. 3D).

Figure 4:
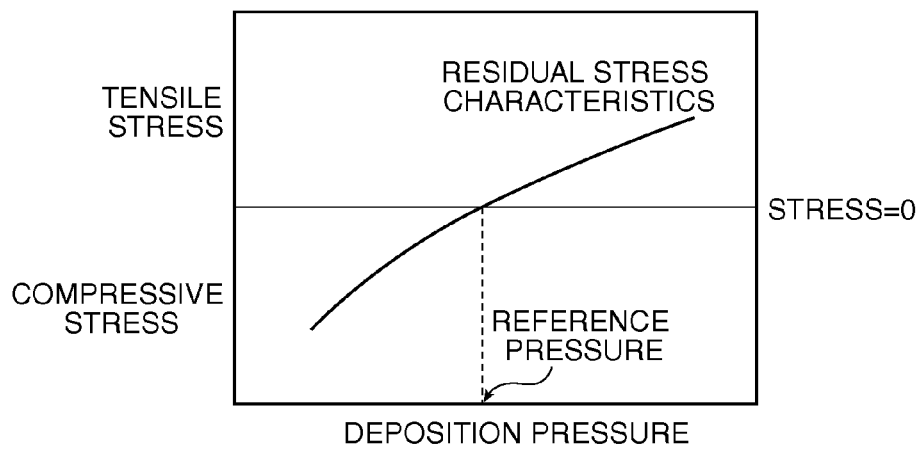
FIG. 4 is a graph illustrating the relationship between sputtering gas pressure during deposition and residual stress in a deposited film.

After the first electrode 20 is formed, the piezoelectric layer 28 is formed at desired positions. First, a piezoelectric layer is formed on the entire surface of the first surface of the substrate including the first electrode 20. The piezoelectric layer is formed using a reactive RF magnetron sputtering method. When the piezoelectric layer is formed of AlN, the thickness of the piezoelectric layer may be in the range of about 2000 Å to 10000 Å. When sputtering the piezoelectric layer, the stress remaining in the formed piezoelectric layer is adjusted particularly by controlling the pressure of sputtering gas. As the sputtering gas, a mixture gas of Ar and $N_2$ can be used, for example. As the mixing ratio of Ar and $N_2$, a ratio of about Ar:$N_2$=1:1 may be used, for example. In this embodiment, as described above, in order to cause the compressive stress to remain in the piezoelectric layer, the pressure of the mixture gas of Ar and $N_2$ is set so as to be lower than a reference pressure. Here, the reference pressure is a pressure which does not cause any residual stress such as compressive stress or tensile stress in the formed piezoelectric layer, and is different depending on the method of using a sputtering device or the setting of a substrate RF power, a target power or the like. Thus, it is necessary to know the reference pressure in advance by conducting an experiment or the like. In this embodiment, when the reference pressure is 0.5 Pa, for example, the gas pressure is set, for example, to 0.1 Pa, which is lower than the reference pressure. The relationship between the mixture gas pressure (deposition pressure) of sputtering gas during deposition and the residual stress occurring in the formed film is illustrated in FIG. 4.

Subsequently, the piezoelectric layer is formed in a desired pattern by performing patterning of the resist and wet-etching in accordance with a photolithography method. When the piezoelectric layer is formed of AlN, a strongly alkaline solution is used as a wet etching solution. An example of the strong alkaline solution includes tetramethylammonium hydroxide. As an acid etching solution, hot phosphoric acid can be used.

The amount of warpage δ of the tip end of the vibrating arm 16 can be calculated by Equation (1).

$$\delta = \frac{3L^2(1-v_s)d}{E_s t^2}\sigma \quad (1)$$

In Equation (1), L is the length of the vibrating arm 16, t is the thickness of the vibrating arm 16, $E_s$ is the Young's modulus of the vibrating arm 16, $v_s$ is the Poisson ratio of the vibrating arm 16, d is the thickness of the piezoelectric layer 28, and σ is the residual stress of the piezoelectric layer 28.

The length L, thickness t, Young's modulus $E_s$, and Poisson ratio $v_s$ of the vibrating arm 16 and the thickness d of the piezoelectric layer 28 are determined in advance by the material or shape thereof. Therefore, the amount of warpage δ can be adjusted by controlling the residual stress σ of the piezoelectric layer 28.

Figure 3E:
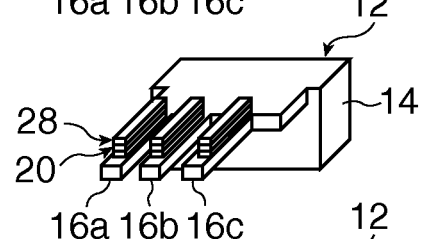
Figure 3F:
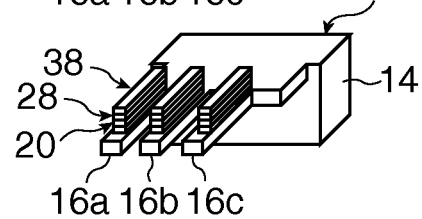

For example, when the vibrating arm 16 in the substrate 12 formed of a quartz crystal has a length L of 500 μm and a thickness t of 10 μm, and the piezoelectric layer 28 formed of AlN has a thickness of 4000 Å, in order to obtain the amount of warpage δ of 25 μm, compressive stress of about 0.8 GPa is required as the residual stress occurring in the piezoelectric layer 28 (see FIG. 3E). If the amount of warpage of the vibrating arm 16 is 25 μm, and the thickness of the element substrate 12a formed of a quartz crystal is 50 μm, the tip end of the vibrating arm 16 can be positioned approximately at the center in the thickness direction thereof. According to such a configuration, even when an excitation power level of 0.1 μW to 1.0 mW is applied to the vibrator element 10, the vibrating arm 16 will not make contact with the inner wall such as a lid 76 or the like of a mounting package 72 (see FIGS. 7A to 8). Furthermore, even when an external impact (1000 G to 10000 G) is applied thereto, the characteristics are not influenced.

After the shape of the piezoelectric layer 28 is formed, the second electrode 38 is formed. The second electrode 38 may be formed similarly to the first electrode 20 by forming a metal layer on the entire surface of the first surface, and forming the shape by performing patterning of the resist and wet-etching in accordance with a photolithography method (see FIG. 3F).

In the embodiment described above, the substrate 12 has been described as being formed of a quartz crystal. However, the vibrator element 10 according to this embodiment is configured to excite vibration in the off-plane direction using the piezoelectric layer 28. Therefore, materials other than a quartz crystal may be used as the material for the substrate 12. Specifically, a piezoelectric material other than a quartz crystal may be used, and semiconductors or the like may be used. When silicon is used as the substrate material, and the length L of the vibrating arm 16 is 500 μm, the thickness t thereof is 10 μm, and the thickness of the piezoelectric layer 28 formed of AlN is 4000 Å, in order to obtain the amount of warpage δ of 25 μm, a compressive stress of about 1.5 GPa is required as the residual stress occurring in the piezoelectric layer 28.

In the embodiment described above, the second electrode 38 has been described as being formed directly on the upper surface of the piezoelectric layer 28. However, the vibrator element 10 according to this embodiment may have an insulating material layer (insulating film) (not shown) which is formed between the piezoelectric layer 28 and the second electrode 38. With such a configuration, even when a through-hole is formed in the piezoelectric layer 28, it is possible to prevent the occurrence of short-circuiting between the first electrode 20 and the second electrode 38. The insulating material layer preferably has a thickness of 50 nm or more from the perspective of preventing short-circuiting. On the other hand, the insulating material layer preferably has a thickness of 500 nm or less from the perspective of suppressing deterioration of the characteristics of the piezoelectric layer 28. Here, the insulating material layer may be formed of $SiO_2$ or $SiN_x$.

Furthermore, an inorganic material layer (inorganic film) (not shown) may be formed on the second surface of the vibrating arm 16 in the vibrator element 10 according to the embodiment described above. By providing an insulating material layer formed of $SiO_2$ or $SiN_x$, it is possible to correct frequency-temperature characteristics. In particular, thermally oxidized silicon dioxides are known to have negative temperature characteristics and are ideal for adjusting the frequency-temperature characteristics.

In the embodiment described above, it has been described that by causing residual stress to occur in the piezoelectric layer 28, compressive stress is caused to occur in the laminated structure. However, in the vibrator element 10 according to this embodiment, the residual stress may occur in the first electrode 20 or the second electrode 38 or in all layers of the laminated structure. With such a configuration, the same effects can also be obtained since the vibrating arm 16 can be warped so that the tip end of the vibrating arm 16 faces the mounting surface 14a side of the base 14. Even when residual stress occurs in the first electrode 20 or the second electrode 38, similarly to the embodiment described above, the residual stress can be adjusted by controlling the mixture gas pressure (deposition pressure) of the sputtering gas.

Figure 5:
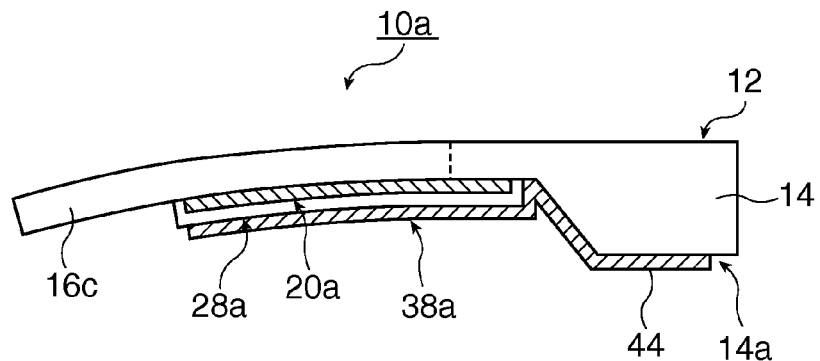
FIG. 5 is a side view of the vibrator element according to the embodiment and illustrates an example in which a laminated structure is formed on a second surface side of a substrate.

Furthermore, in the embodiment described above, the laminated structure has been described as being formed on the first surface of the substrate 12. Although the forming of the laminated structure on the first surface can be performed easily since there is no step between the vibrating arm 16 and the base 14, the vibrator element according to this embodiment may have the laminated structure which is formed on the second surface side as illustrated in FIG. 5. In such a configuration, tensile residual stress occurs in the laminated structure. Specifically, in the sputtering process for forming a piezoelectric layer 28a or the layers of a first electrode 20a, a second electrode 38a, and the like, the gas pressure of the sputtering gas may be increased to be higher than the reference pressure. For example, in order to cause tensile stress to occur in the piezoelectric layer 28a, the mixture gas pressure (deposition pressure) of the sputtering gas may be set to about 2.0 GPa. In a vibrator element 10a having such a configuration, the same effects as those of the vibrator element 10 according to the embodiment described above can be obtained.

Figure 6:
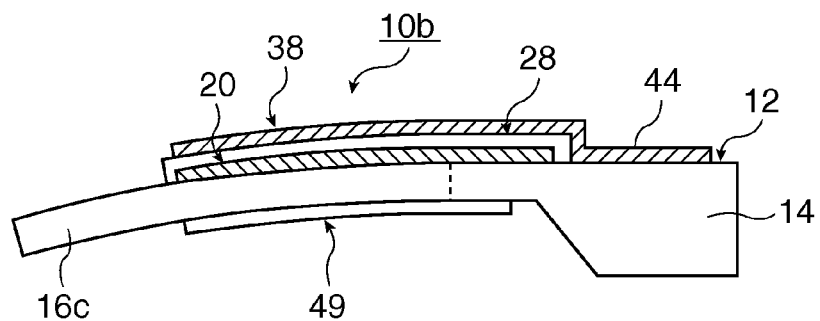
FIG. 6 is a side view of the vibrator element according to the embodiment and illustrates an example in which a laminated structure is formed on a first surface side of a substrate and a stress adjustment film is formed on a second surface side thereof.

In the vibrator element according to this embodiment, as illustrated in FIG. 6, the laminated structure may be formed on the first surface side of the substrate 12, and a stress adjustment film 49 may be formed on the second surface side. Here, the stress adjustment film 49 may be a metal film having the same configuration as the first electrode 20 or the second electrode 38 and may be a film having the same configuration as the piezoelectric layer 28. In such a configuration, the laminated structure formed on the first surface may be configured to have compressive stress as residual stress, and the stress adjustment film 49 may be configured to have tensile stress as residual stress. In a vibrator element 10b having such a configuration, the same effects as those of the vibrator elements 10 and 10a according to the embodiments described above can be obtained.

In the embodiments described above, the vibrator element has been described as having a plurality of vibrating arms. However, in an aspect of the invention, the number of vibrating arms is not particularly limited, and the vibrator element may have only one vibrating arm.

Figure 7A:
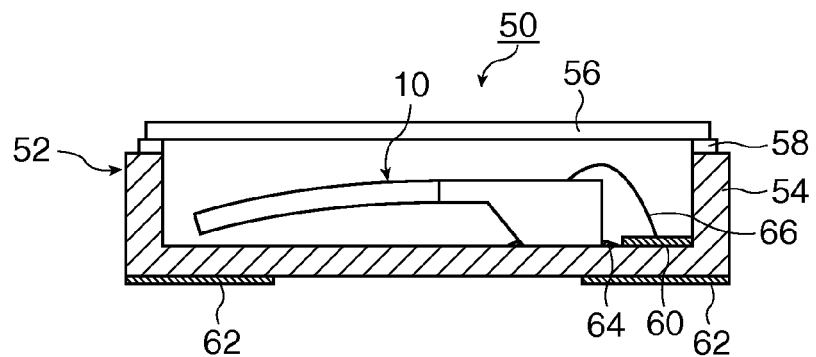
FIG. 7A is a view illustrating a configuration of a vibrator in which the vibrator element according to the embodiment is mounted.

Next, an embodiment of a vibrator according to an aspect of the invention will be described with reference to FIG. 7A. A vibrator 50 according to this embodiment includes the vibrator element 10 and a package 52 that mounts the vibrator element 10 therein.

The vibrator element 10 uses the vibrator element 10 according to the embodiment described above. The package 52 basically includes a package base 54 and a lid 56. The package base 54 has a box shape and includes vibrator element mounting terminals 60 therein. On the other hand, the package base 54 has external mounting terminals 62 which are provided on the outer bottom surface thereof so as to be electrically connected to the vibrator element mounting terminals 60.

The package base 54 having such a configuration may be formed of an insulating material, and can be formed by stacking a flat plate and a frame-shaped ceramic green sheet, for example, and baking the stacked structure. The vibrator element mounting terminals 60 and the external mounting terminals 62 can be formed by performing screen printing on the ceramic green sheet.

The lid 56 may be a flat plate formed of metal, glass or the like. The lid 56 is preferably formed of a material having approximately the same linear expansion coefficient as the constituent material of the package base 54. This is to suppress the occurrence of cracking or peeling due to a change in temperature. When the package base 54 is formed of a ceramic material, Kovar (alloy), soda-lime glass, or the like may be used.

The package base 54 and the lid 56 are bonded by welding using a soldering material 58. When the lid 56 is formed of metal, low-melting point metal may be used as the soldering material 58. When the lid 56 is formed of glass, low-melting point glass may be used as the soldering material 58.

When manufacturing the vibrator 50 formed of such a constituent material according to this embodiment, first, the vibrator element 10 is mounted inside the package base 54. The vibrator element 10 may be mounted using an adhesive 64. After the vibrator element 10 is mounted in the package base 54, wire bonding is performed using gold wires 66 or the like, and the vibrator element mounting terminals 60 are electrically connected to the input/output terminals 42 and 44 (see FIGS. 1A to 1C) of the vibrator element 10. In this way, after the vibrator element 10 is mounted, the lid 56 is bonded to the package base 54, and the opening is sealed.

Figure 7B:
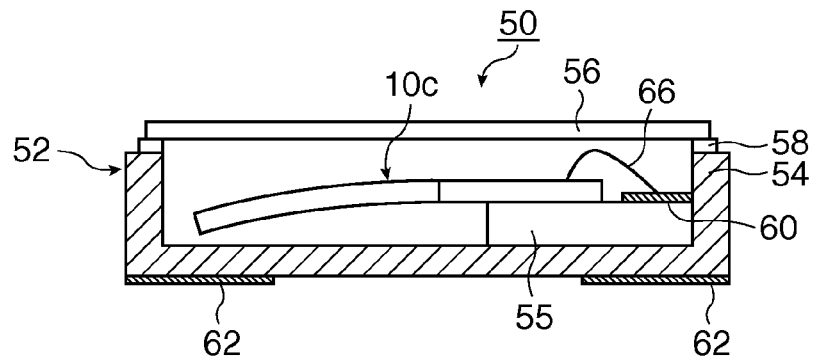
FIG. 7B is a view illustrating a configuration of a vibrator in which a vibrator element having a planar shape is mounted.

In the above description, although only the shape of the vibrator element in which the base is thicker than the vibrating arm has been described, the invention can be applied to other shapes of the vibrator element. For example, as illustrated in FIG. 7B, a vibrator element 10c having a planar shape in which the base is not thicker than the vibrating arm may be used. In the example of FIG. 7B, a step 55 is formed on the inner bottom surface of the package 52, the vibrator element mounting terminals 60 formed on the step 55 are electrically connected by wire bonding to the input/output terminals 42 and 44 (having the same planer shape illustrated in FIGS. 1A to 1C) of the vibrator element 10c, and a void is formed between the vibrator element 10c and the package base 54 by the step 55.

Moreover, the package base 54 and the vibrator element 10c may be electrically connected using Au bumps or a conductive adhesive instead of wire bonding.

According to the vibrator 50 having such a configuration, even when the package 52 is a thin type, there is no possibility that the vibrating arm 16 (see FIGS. 1A to 1C) of the vibrator element 10 makes contact with the lid 56 of the package 52 when the vibrating arm 16 performs flexural vibration. Therefore, this contributes to the manufacture of the small, high-performance, and high-reliability vibrator 50. In the vibrator 50 according to this embodiment, although the package base 54 has a box shape and the lid 56 has a flat plate shape, the package base may have a flat plate shape and the lid may have a cap shape.

Next, an embodiment of an oscillator according to an aspect of the invention will be described with reference to FIG. 8. An oscillator 70 according to this embodiment basically includes a vibrator element 10, an electronic component 82 for oscillating the vibrator element 10, and a package 72 that mounts the vibrator element 10 and the electronic component 82 therein.

The vibrator element 10 uses the vibrator element 10 according to the embodiment described above. The package 72 basically includes a package base 74 and a lid 76. The package base 74 according to this embodiment includes upper and lower cavities which are respectively disposed above and below a central mounting substrate 74a. The upper cavity is used as a vibrator element mounting region 75a, and the lower cavity is used as an electronic component mounting region 75b.

The vibrator element mounting terminals 60 are provided on a side of the central substrate 74a close to the vibrator element mounting region 75a, and electronic component mounting terminals 80 are provided on a side of the central substrate 74a close to the electronic component mounting region 75b. Moreover, external mounting terminals 86 which are electrically connected to the electronic component mounting terminals 80 are formed on a portion corresponding to the bottom surface of the package base 74. The constituent materials and the manufacturing method are the same as those of the package base 54 of the vibrator 50 described above. Moreover, in this embodiment, the lid 76 may be a flat plate formed of metal or glass, and the vibrator element mounting region 75a of the package base 74 is sealed using a soldering material 78.

The electronic component 82 may be an IC or the like having an oscillation circuit, for example, and the electronic component mounting terminals 80 may be mounted by flip-chip bonding using bumps 84.

According to the oscillator 70 having such a configuration, similarly to the vibrator 50, even when it is mounted in the thin package 72, there is no possibility that the vibrating arm 16 (see FIGS. 1A to 1C) makes contact with the lid 76 of the package 72 when the vibrating arm 16 performs flexural vibration. Therefore, this can contribute to the manufacture of the small, high-performance, and high-reliability oscillator 70.

Figure 8:
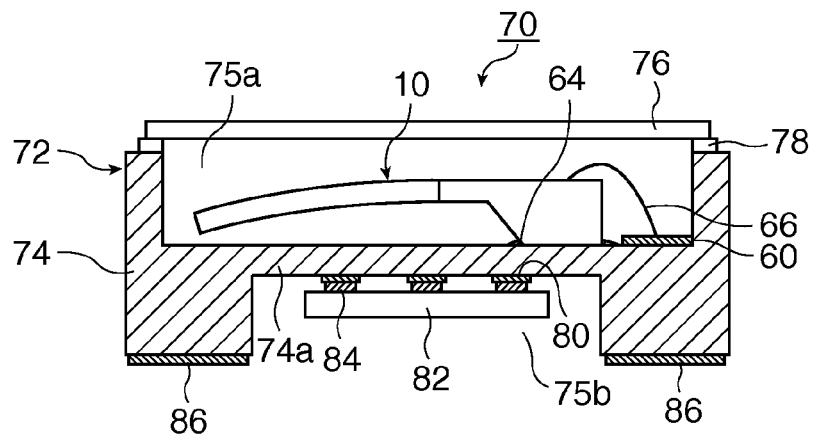
FIG. 8 is a view illustrating a configuration of an oscillator in which the vibrator element according to the embodiment and an electronic component having a circuit for oscillating the vibrator element are mounted.

Although FIG. 8 illustrates a structure in which the vibrator element and the electronic component are mounted in one package, the vibrator element and the electronic component may be individually packaged, and the vibrator element and the electronic component may be directly mounted on a printed board without being mounted in the package.

Figure 9:
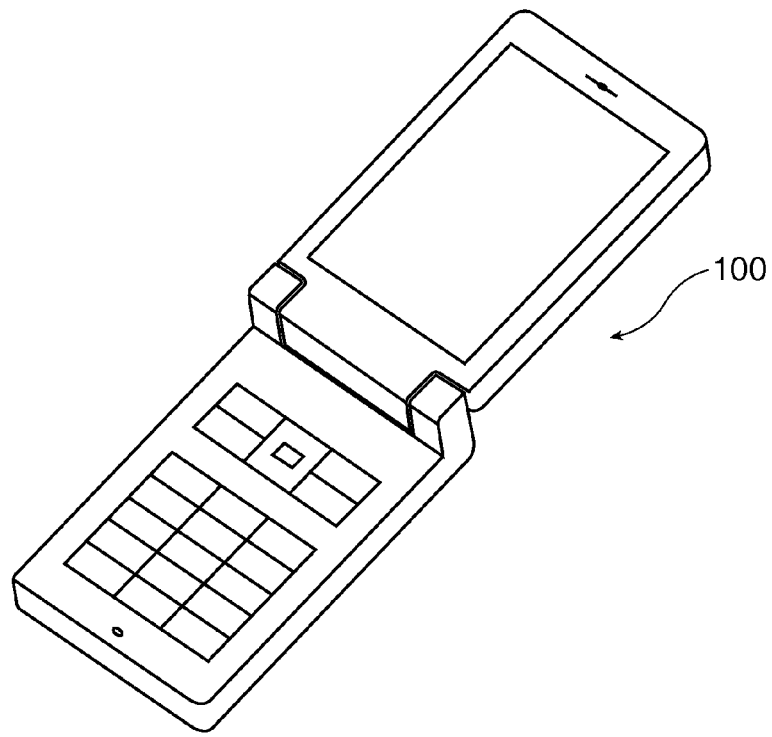
FIG. 9 is a view illustrating a mobile phone as an example of an electronic device in which at least one of the vibrator and the oscillator according to the embodiment is mounted.
Figure 10:
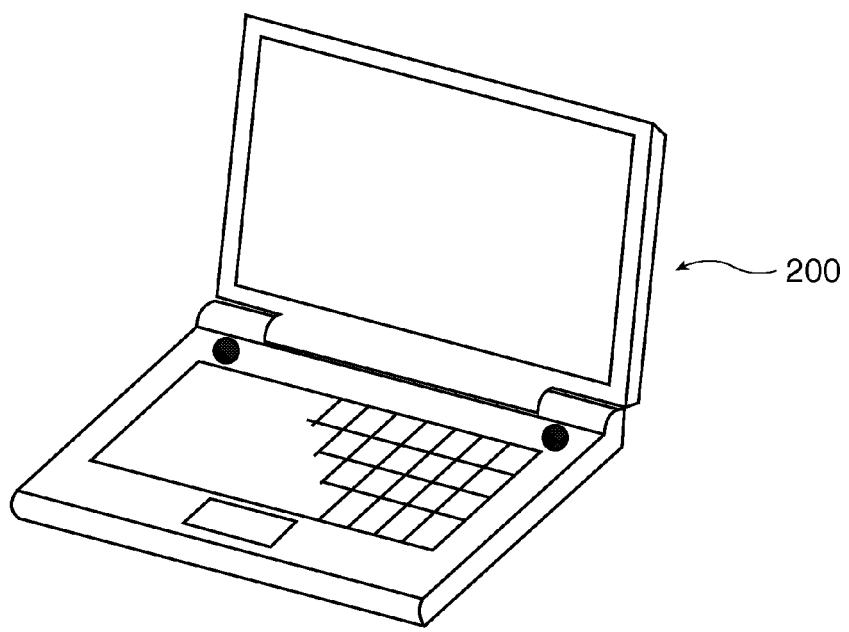
FIG. 10 is a view illustrating a personal computer as an example of an electronic device in which at least one of the vibrator and the oscillator according to the embodiment is mounted.

An example of an electronic device according to an aspect of the invention includes a mobile phone 100 illustrated in FIG. 9, a personal computer 200 illustrated in FIG. 10, and the like. The electronic devices are configured to include the vibrator element 10 and the vibrator 50 or the oscillator 70, illustrated in the embodiments which are mounted as a clock source or a local oscillator used for modulating or demodulating signals. With such a configuration, it is possible to cope with miniaturization and reduction in the thickness of the electronic devices. Moreover, even when the electronic devices are miniaturized, it is possible to increase the accuracy of communication or the like appropriate for the functions of the electronic devices.

What is claimed is:

1. A vibrator element comprising:
   a base;
   a vibrating arm that is extended from the base, that has a first surface and a second surface opposite to the first surface, and that performs flexural vibration in a direction normal to the first and second surfaces; and
   a laminated structure that is provided on at least one of the first and second surfaces of the vibrating arm and that includes at least a first metal layer, a second metal layer, and a piezoelectric layer disposed between the first and second metal layers, wherein the base is positioned adjacent the second surface, the base has a protrusion that is projected from the second surface in a thickness direction of the vibrating arm, and the vibrating arm is warped toward an edge of the protrusion when the vibrating arm is not undergoing flexural vibration.

2. The vibrator element according to claim 1,
wherein when the length of the vibrating arm is L, the thickness of the vibrating arm is t, the Young's modulus of the vibrating arm is $E_s$, the Poisson ratio of the vibrating arm is $v_s$, the thickness of the piezoelectric layer is d, and the residual stress of the piezoelectric layer is σ, the amount of warpage δ of the vibrating arm is obtained by the following equation:

$$\delta = \frac{3L^2(1-v_s)d}{E_s t^2}\sigma.$$

3. The vibrator element according to claim 1, wherein
the base has a principal surface that is positioned on a side of the first surface,
the protrusion has a protruding surface that is opposite to the principal surface, and
the vibrating arm performs the flexural vibration within a range between the protruding surface and the principal surface.

4. The vibrator element according to claim 1, wherein
the piezoelectric layer is formed on both the first and second surfaces.

5. A method for manufacturing a vibrator element, which includes: a base; a vibrating arm which is extended from the base; and a laminated structure that is provided at the vibrating arm and that includes at least a first metal layer, a second metal layer, and a piezoelectric layer disposed between the first and second metal layers, the method comprising:

providing a first surface and a second surface opposite to the first surface at the vibrating arm;

providing the base adjacent the second surface, and forming a protrusion of the base that is projected from the second surface in a thickness direction of the vibrating arm; and forming the laminated structure on a side of the first surface, wherein at least one of the first metal layer, the second metal layer, and the piezoelectric layer is formed so that compressive stress remains therein when the vibrating arm is not undergoing flexural vibration.

6. A method for manufacturing a vibrator element, which includes: a base; a vibrating arm which is extended from the base; and a laminated structure that is provided at the vibrating arm and that includes at least a first metal layer, a second metal layer, and a piezoelectric layer disposed between the first and second metal layers, the method comprising:

providing a first surface and a second surface opposite to the first surface at the vibrating arm;

providing the base adjacent the second surface, and forming a protrusion of the base that is projected from the second surface in a thickness direction of the vibrating arm; and forming the laminated structure on the side of the second surface, wherein at least one of the first metal layer, the second metal layer, and the piezoelectric layer is formed so that compressive stress remains therein when the vibrating arm is not undergoing flexural vibration.

7. A vibrator comprising:
the vibrator element according to claim 1; and
a package having the vibrator element mounted therein.

8. An oscillator comprising:
the vibrator element according to claim 1; and
an electronic component for driving the vibrator element.

9. An electronic device in which the vibrator element according to claim 1 is mounted.

* * * * *